(12) United States Patent
Sun et al.

(10) Patent No.: US 7,453,950 B2
(45) Date of Patent: Nov. 18, 2008

(54) SYSTEM AND METHOD OF EFFICIENTLY MODULATING DATA USING SYMBOLS HAVING MORE THAN ONE PULSE

(75) Inventors: Weimin Sun, Westborough, MA (US); Tao Liang, Westford, MA (US)

(73) Assignee: Intel Corporation, Santa Clara, CA (US)

( * ) Notice: Subject to any disclaimer, the term of this patent is extended or adjusted under 35 U.S.C. 154(b) by 973 days.

(21) Appl. No.: 10/369,933

(22) Filed: Feb. 18, 2003

(65) Prior Publication Data

US 2004/0161051 A1    Aug. 19, 2004

(51) Int. Cl.
*H03C 5/00* (2006.01)
(52) U.S. Cl. .................. 375/268; 375/259; 375/239
(58) Field of Classification Search .......... 375/239, 375/259, 268; 332/106, 112
See application file for complete search history.

(56) References Cited

U.S. PATENT DOCUMENTS

| | | | |
|---|---|---|---|
| 6,009,488 A | 12/1999 | Kavipurapu | |
| 6,212,230 B1 | 4/2001 | Rybicki et al. | |
| 6,295,272 B1 * | 9/2001 | Feldman et al. | 370/210 |
| 6,687,293 B1 * | 2/2004 | Loyer et al. | 375/239 |
| 2001/0006538 A1 * | 7/2001 | Simon et al. | 375/259 |

OTHER PUBLICATIONS

T. Lueftner, Et Al., *Edge-position modulation for high-speed wireless infrared communications*, IEE Proceedings-Optoelectronics, Oct. 17, 2003, pp. 427-437, vol. 150, No. 5, UK.

* cited by examiner

*Primary Examiner*—Mohammad H. Ghayour
*Assistant Examiner*—Juan A Torres
(74) *Attorney, Agent, or Firm*—Blakely, Sokoloff, Taylor & Zafman LLP

(57) ABSTRACT

A method and apparatus to improve modulation efficiency. A symbol is created in which the relative position of a second pulse is a symbol period encode at least one bit. The symbol is transmitted across a communication channel. The one or more bits modulated by the position of the second pulse are recovered such that high bit rate communication may occur without channel compensation.

21 Claims, 7 Drawing Sheets

SYSTEM AND METHOD OF EFFICIENTLY MODULATING DATA USING SYMBOLS HAVING MORE THAN ONE PULSE

BACKGROUND

1. Field

Embodiments of the invention relate to modulation. More specifically, embodiments of the invention relate to an improved encoding density modulation scheme.

2. Description of the Related Art

Various forms of modulation have long been used to encode data with greater efficiency so that more data can be transmitted during a particular time period over a transmission medium. Combinations of various modulation techniques such as, pulse width modulation, amplitude modulation and rise time modulation have been employed to improve the encoding density of modulation schemes. See for example, copending application entitled "Symbol-Based Signaling For An Electromagnetically-Coupled Bus System," Ser. No. 09/714,244. However, such schemes often require per-emphasis and channel equalization which increases the cost and complexity of the system. Moreover, in any event it remains desirable to improve coding density to allow for even higher bit rates.

DETAILED DESCRIPTION

Figure 1:
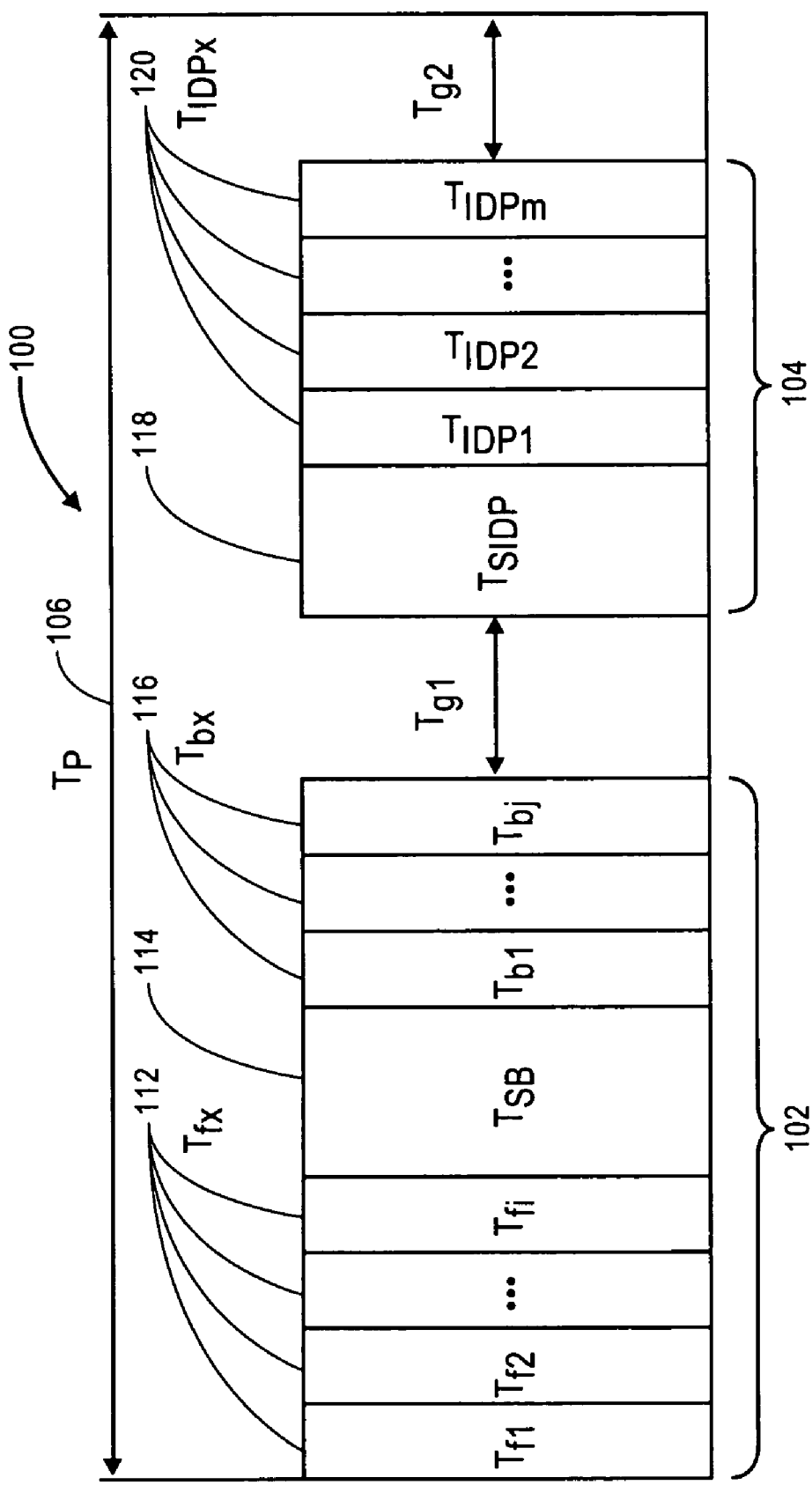
FIG. 1 is a diagram showing a generalized format of a symbol of one embodiment of the invention.

FIG. 1 is a diagram showing a generalized format of a symbol of one embodiment of the invention. The symbol 100 occurs within a symbol period ($T_p$) 106. The symbol includes a first pulse 102 alternatively referred to as a basic pulse 102 and N additional pulses 104. In FIG. 1 N is equal to one, however, N could be any positive integer. Additional pulses are alternatively referred to herein as IDP pulses 104.

The basic pulse 102 includes i leading slots 112, where i is a positive integer, a base pulse 114 and j lagging slots 116, where j is also a positive integer. The IDP pulse 104 includes a base pulse 118 and m lagging slots where m is a positive integer. Notably, i, j and m are not necessarily equal. In FIG. 1, $T_{fx}$ is the width of a leading slot 112, $T_{bx}$ is a width of the lagging slot 116 (alternatively referred to as front end slots and back end slots respectively) of the basic pulse 102 and $T_{IDPx}$ is a width of the lagging slot 120 of the IDP pulse 104. The slot width between leading slots and lagging slots and between the pulses may not be equal.

$T_{SB}$ is the width of the base pulse 114 of the basic pulse 102. $T_{SIDP}$ is the width of the base pulse 118 of the IDP pulse. $T_{SB}$ and $T_{SIDP}$ are selected in one embodiment to be the minimum pulse that can be properly propagated along the communication channel without the necessity of channel compensation such as equalization. The basic pulse 102 is separated from the IDP pulse 104 by a gap with $T_{g1}$.

If additional IDP pulses are present within the symbol period, they will each be separated from their predecessor by a gap. It is not necessary that all additional pulse have a same format. As used herein, format refers to the base pulse and lagging slots. Thus, a same format has an equal number and equal size of slots and a same width base pulse. Thus, where $m_x \neq m_y$, a different format exists, where x & y refer to distinct additional pulses. A final gap occurs after the last IDP pulse 104, in this case, having a gap width $T_{g2}$. Amplitude modulation (AM) can be used separately on each pulse. This provides two bits of modulation (one per pulse) if return to zero (RZ) AM is used or four bits of modulation (two per pulse) if non return to zero (NRZ) AM is used.

Figure 2:
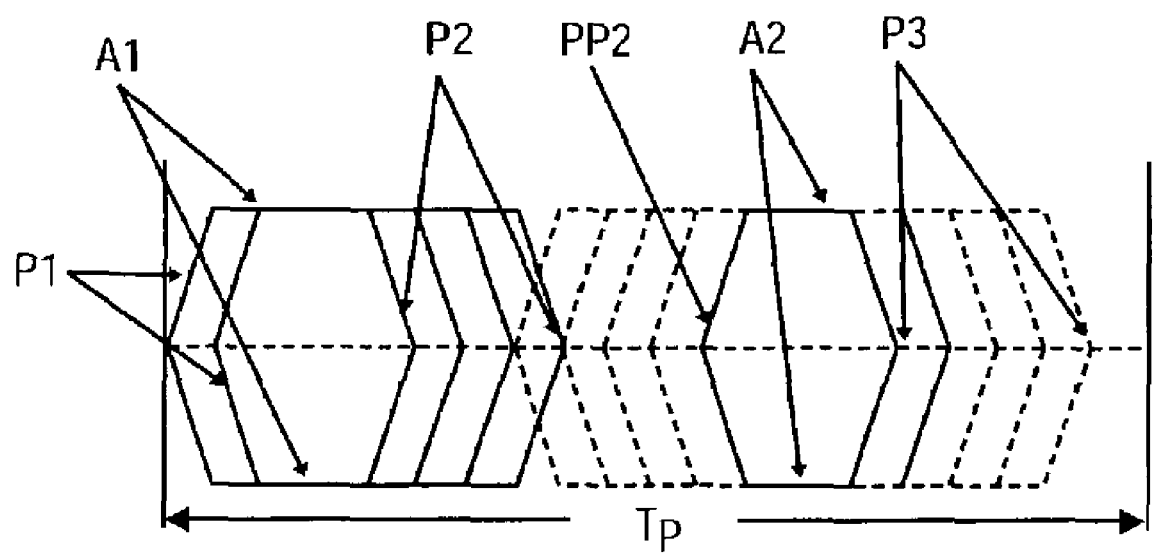
FIG. 2 is a diagram showing the modulation elements of symbol of one embodiment of the invention that encodes eight databits.

FIG. 2 is a diagram showing the modulation elements of a symbol of one embodiment of the invention that encodes eight data bits. P1 is the possible starting position of the front edge of the basic pulse. A1 is the possible polarization of the basic pulse. P2 is the possible back edge position of the basic pulse. PP2 is a possible starting position of the base pulse of the IDP pulse. A2 is the possible polarization of the IDP pulse. P3 is the possible position of the back edge of the IDP pulse. In this case, referring back to the nomenclature of FIG. 1, i equals 1, j equals 3 and m equals 4.

FIGS. 3a-3e are diagrams of possible symbols to encode eight bits per symbol in accordance with modulation elements discussed in connection with FIG. 2. As can be seen, the relative position of the base pulse of the IDP pulse varies within the symbol period. This variance of the position of the base pulse of the IDP pulse encodes at least one bit, and in this example, two bits of data. Stated slightly differently, the relationship between the pulses improves modulation efficiency. The position the IDP pulse may assume depends on the duration of the basic pulse. The IDP pulse is thus moveable within the symbol period $T_p$. Conversely, in one embodiment, the location of the base pulse of the basic pulse is fixed within $T_p$.

Figure 3A:
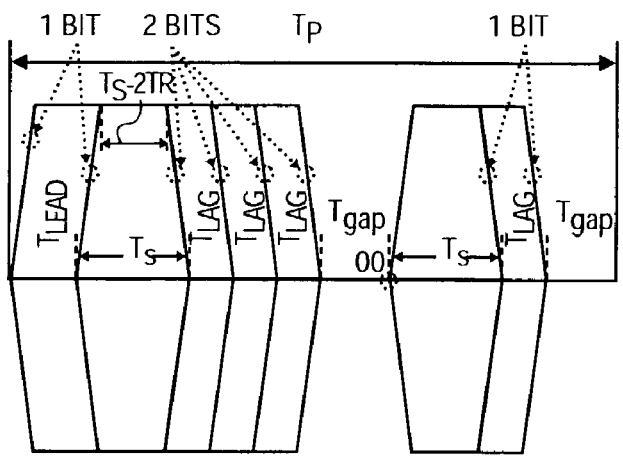
FIGS. 3a-3e are diagrams of possible symbols to encode eight bits per symbol.
Figure 3B:
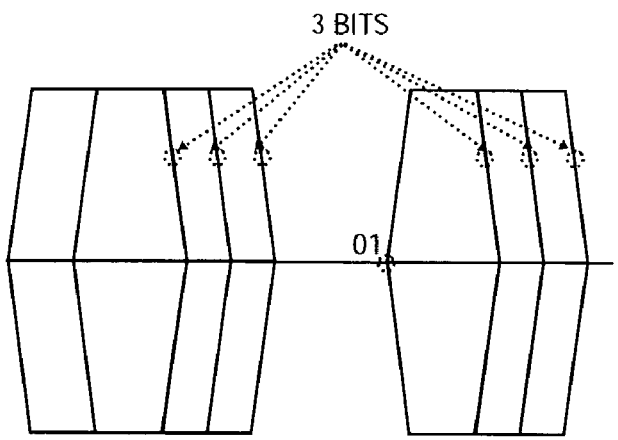
Figure 3C:
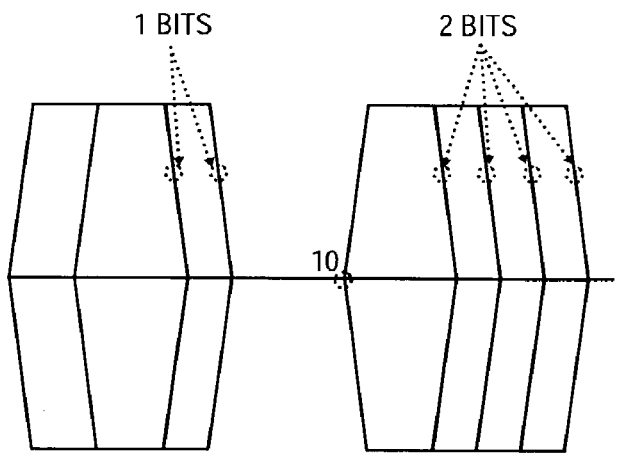
Figure 3D:
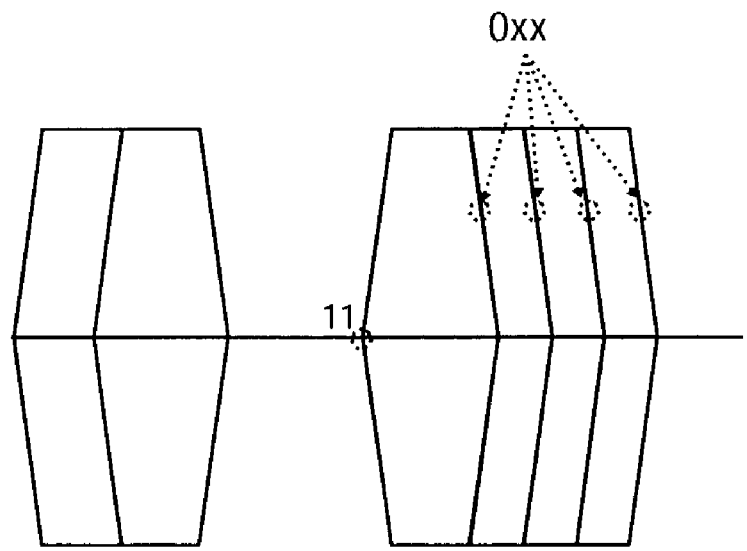
Figure 3E:
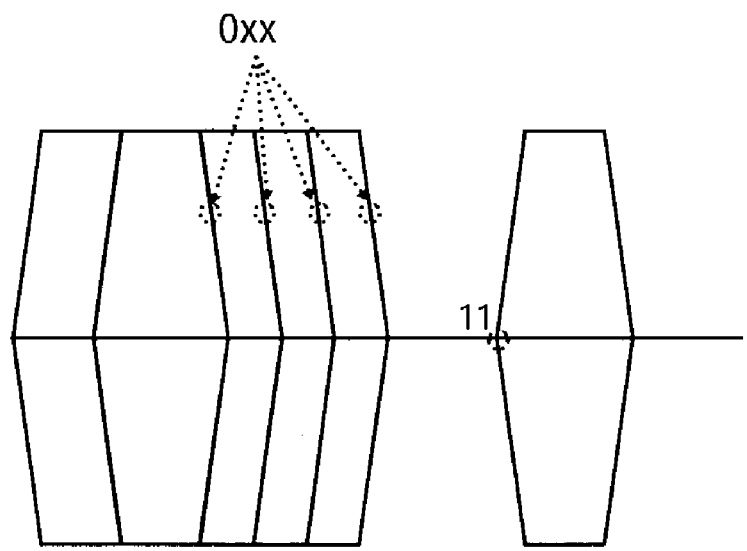

In this 8-bit modulation example, two bits are associated with the amplitude modulation (one for basic pulse the other for IDP pulse). This assumes RZ AM. One bit is modulated by the front edge of basic pulse. Five bits are modulated by the combinations of the basic pulse and the IDP pulse. In FIG. 3a, two bits are modulated by the back edge of basic pulse and one bit is modulated by back edge of IDP pulse, which yields eight possible states. In FIG. 3b, the combination of basic pulse's back edges (three edge positions) and the IDP pulse's back edges (three edge positions) results in total of nine states. FIG. 3c yields eight states, similar to FIG. 3a. FIG. 3d, e provide an additional eight possible states. The total combinations for FIGS. 3a-e, provide more than 32 states for five bits of modulation. These states are addressed further below in connection with Tables 6-10.

Tables 1 through 5 show one possible mapping of the data to the symbols shown in FIGS. 3a-3e respectively.

TABLE 1

| | |
|---|---|
| D0 | A1 (1 = HIGH, 0 = LOW) |
| D1 | P1 (0 = edge__0, 1 = edge__1) |
| D2 = 0 | PP2 |
| D3 = 0 | PP2 |
| D4 | P2 |
| D5 | P2 |
| D6 | A2 (1 = HIGH, 0 = LOW) |
| D7 | P3 |

TABLE 2

| | |
|---|---|
| D0 | A1 (1 = HIGH, 0 = LOW) |
| D1 | P1 (0 = edge_0, 1 = edge_1) |
| D2 = 1 | PP2 |
| D3 = 0 | PP2 |
| D4 | P2 & P3 |
| D5 | P2 & P3 |
| D6 | P2 & P3 |
| D7 | A2 (1 = HIGH, 0 = LOW) |

TABLE 3

| | |
|---|---|
| D0 | A1 (1 = HIGH, 0 = LOW) |
| D1 | P1 |
| D2 = 0 | PP2 |
| D3 = 1 | PP2 |
| D4 | P2 |
| D5 | A2 (1 = HIGH, 0 = LOW) |
| D6 | P2 |
| D7 | P3 |

TABLE 4

| | |
|---|---|
| D0 | A1 (1 = HIGH, 0 = LOW) |
| D1 | P1 |
| D2 = 1 | PP2 |
| D3 = 1 | PP2 |
| D4 = 0 | P2 |
| D5 | A2 (1 = HIGH, 0 = LOW) |
| D6 | P3 |
| D7 | P3 |

TABLE 5

| | |
|---|---|
| D0 | A1 (1 = HIGH, 0 = LOW) |
| D1 | P1 |
| D2 = 1 | PP2 |
| D3 = 1 | PP2 |
| D4 = 1 | P3 |

TABLE 5-continued

| | |
|---|---|
| D5 | P2 |
| D6 | P2 |
| D7 | A2 (1 = HIGH, 0 = LOW) |

One of ordinary skill will recognize that various other mappings are possible and are within the scope and contemplation of embodiments of the invention.

Referring again to FIGS. 3a-e, in one embodiment, the symbol period, $T_P$ is 2000 ps. $T_{LEAD}$ (width of the leading slot) is 240 ps, $T_s$ is 320 ps $T_{LAG}$ (width of the lagging slot for both pulses) is 160 ps, and the gap width $T_{gap}$ is 240 ps. In such an embodiment, data rates of 4 Gbps can be achieved on a 30" channel with two ball grid array (BGA) packages and two connectors. A wide leading slot is used because the leading edge of the first pulse is most effected by what occurred on the channel previously. Thus, by making the slot wider, it is less likely that channel noise will cause a misinterpretation of the location of the front edge.

In an alternative embodiment, $T_P$ is 1250 ps with $T_{LEAD}$ is 130 ps, $T_s$ is 200 ps, $T_{LAG}$ is 110 and $T_{gap}$ is $140_{ps}$. This permits data rates of 6.4 Gbps on a 5" channel.

In an alternative embodiment, $T_P$ is 1000 ps. $T_{LEAD}$ is 110 ps, $T_s$ is 135 ps, $T_{LAG}$ is 100 ps and $T_{gap}$ is 110 ps. This embodiment permits data rates of 8 Gbps on a 5" channel.

Figure 4:
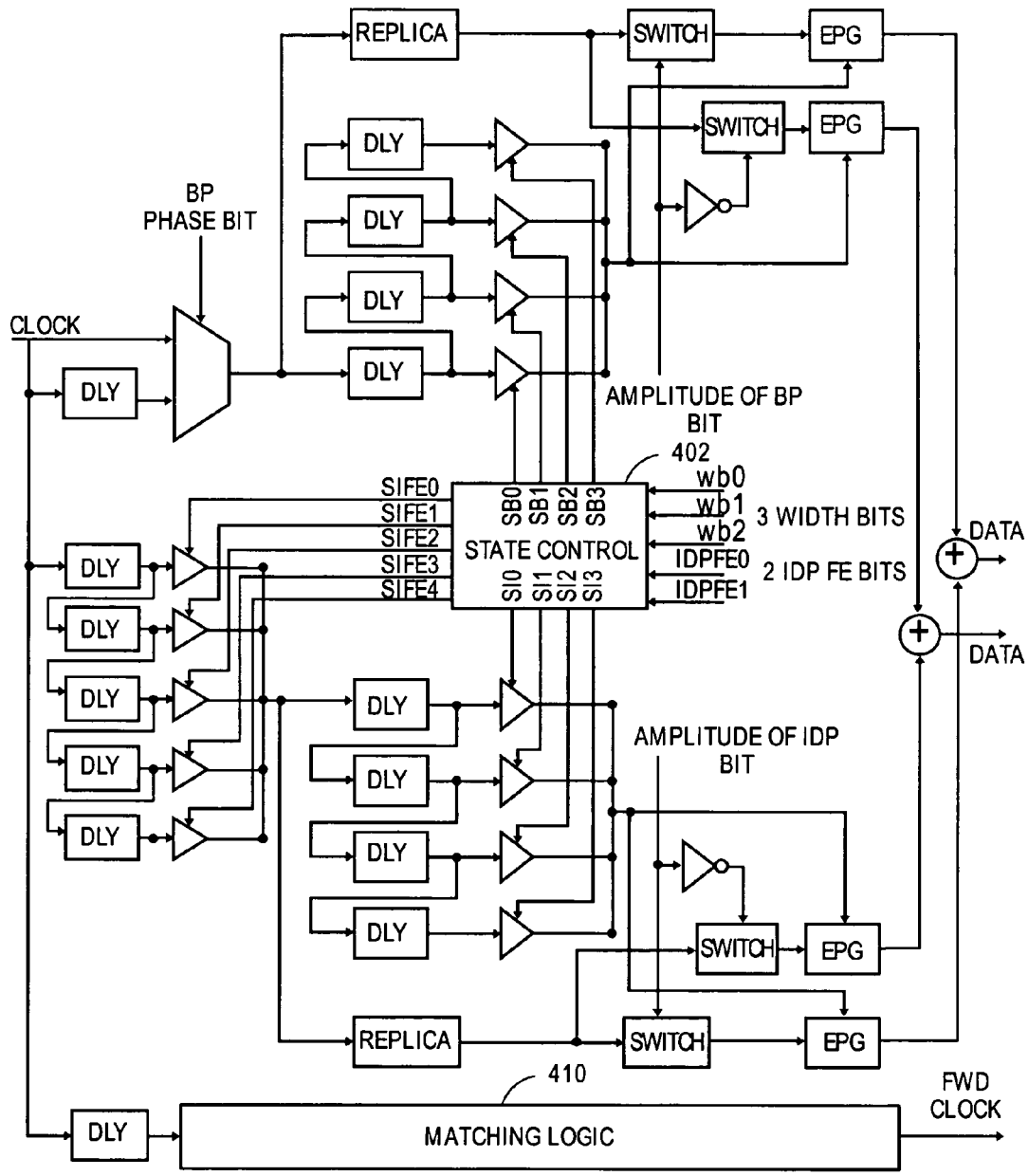
FIG. 4 is a block diagram of a modulator of one embodiment of the invention.

FIG. 4 is a block diagram of a modulator of one embodiment of the invention. A three width bits wb0 through wb2 and the two IDP front edge bits IDPFE0 and IDPFE1 provide the inputs to the state control unit 402. Based on these inputs, the state control unit enables or disables various signal paths through the modulator and therefore frequency controls the pulses created by the electric pulse generation units to form the symbol. The various signal paths are driven through a plurality of delays to effect the creation of the symbols of the forms previously described. Tables 6-10 show the response of the state control unit 402 based on the inputs. In these tables "0" means pass and "1" means stop.

TABLE 6

| IDPFE0 | IDPFE1 | Wb0 | Wb1 | Wb2 | SB0 | SB1 | SB2 | SB3 | SI0 | SI1 | SI2 | SI3 |
|---|---|---|---|---|---|---|---|---|---|---|---|---|
| 19. (Enable) | 0 | 0 | 0 | | 0 | 1 | 1 | 1 | | | | |
| | | 0 | 1 | | 1 | 0 | 0 | 1 | | | | |
| | | 1 | 0 | | 1 | 1 | 0 | 1 | | | | |
| | | 1 | 1 | | 1 | 1 | 1 | 0 | | | | |
| | | | | 0 | | | | | 0 | 1 | 1 | 1 |
| | | | | 1 | | | | | 1 | 0 | 1 | 1 |

TABLE 7

| IDPFE0 | IDPFE1 | Wb0 | Wb1 | Wb2 | SB0 | SB1 | SB2 | SB3 | SI0 | SI1 | SI2 | SI3 |
|---|---|---|---|---|---|---|---|---|---|---|---|---|
| 1. (Enable) | 1 | 0 | 0 | 0 | 0 | 1 | 1 | 1 | 0 | 1 | 1 | 1 |
| | | 0 | 0 | 0 | 0 | 1 | 1 | 1 | 1 | 1 | 1 | 1 |
| | | 0 | 1 | 0 | 0 | 1 | 1 | 1 | 1 | 1 | 0 | 1 |
| | | 0 | 1 | 1 | 1 | 0 | 1 | 1 | 0 | 1 | 1 | 1 |
| | | 1 | 0 | 0 | 1 | 1 | 0 | 1 | 1 | 1 | 0 | 1 |
| | | 1 | 0 | 1 | 1 | 0 | 1 | 1 | 1 | 0 | 1 | 1 |
| | | 1 | 1 | 0 | 1 | 1 | 0 | 1 | 0 | 1 | 1 | 1 |
| | | 1 | 0 | 1 | 1 | 1 | 0 | 1 | 1 | 0 | 1 | 1 |

TABLE 8

| IDPFE0 | IDPFE1 | Wb0 | Wb1 | Wb2 | SB0 | SB1 | SB2 | SB3 | SI0 | SI1 | SI2 | SI3 |
|---|---|---|---|---|---|---|---|---|---|---|---|---|
| 20. (Enable) | 0 | 0 | 0 | | | | | | 0 | 1 | 1 | 1 |
| | | 0 | 0 | | | | | | 0 | 1 | 1 | 1 |
| | | 1 | 0 | | | | | | 1 | 1 | 0 | 1 |
| | | 1 | 1 | | | | | | 1 | 1 | 1 | 0 |
| | | | | 0 | 0 | 1 | 1 | 1 | | | | |
| | | | | 1 | 1 | 0 | 1 | 1 | | | | |

TABLE 9

| IDPFE0 | IDPFE1 | Wb0 | Wb1 | Wb2 | SB0 | SB1 | SB2 | SB3 | SI0 | SI1 | SI2 | SI3 |
|---|---|---|---|---|---|---|---|---|---|---|---|---|
| 21. (Enable) | 1 | 0 | 0 | 0 | 0 | 1 | 1 | 1 | 0 | 1 | 1 | 1 |
| | | | 0 | 0 | 0 | 1 | 1 | 1 | 0 | 1 | 1 | 1 |
| | | | 1 | 0 | 1 | 1 | 0 | 1 | 0 | 1 | 1 | 1 |
| | | | 1 | 1 | 1 | 1 | 1 | 0 | 0 | 1 | 1 | 1 |
| | | 1 | 0 | 0 | 0 | 1 | 1 | 1 | 0 | 1 | 1 | 1 |
| | | | 0 | 1 | 0 | 1 | 1 | 1 | 1 | 0 | 1 | 1 |
| | | | 1 | 0 | 0 | 1 | 1 | 1 | 1 | 1 | 0 | 1 |
| | | | 1 | 1 | 0 | 1 | 1 | 1 | 1 | 1 | 1 | 0 |

TABLE 10

| IDPFE0 | IDPFE1 | Wb0 | SIFE0 | SIFE1 | SIFE2 | SIFE3 | SIFE4 |
|---|---|---|---|---|---|---|---|
| 0 | 0 | | 1 | 1 | 1 | 0 | 1 |
| 0 | 1 | | 1 | 1 | 0 | 1 | 1 |
| 1 | 0 | | 1 | 0 | 1 | 1 | 1 |
| 1 | 1 | 0 | 0 | 1 | 1 | 1 | 1 |
| 1 | 1 | 1 | 1 | 1 | 1 | 1 | 0 |

Tables 6-9 define the back edge modulation for the basic pulse (SB0-SB3) and the IDP pulse SI0-SI3. Table 10 defines the IDP pulse front edge delay states. In the aggregate, the states provide for modulation consistent with the mappings of Tables 1-5, and are implemented by state control 402 in one embodiment. Matching logic 410 insures that the forwarded clock is time consistent with the symbol generated.

Figure 5:
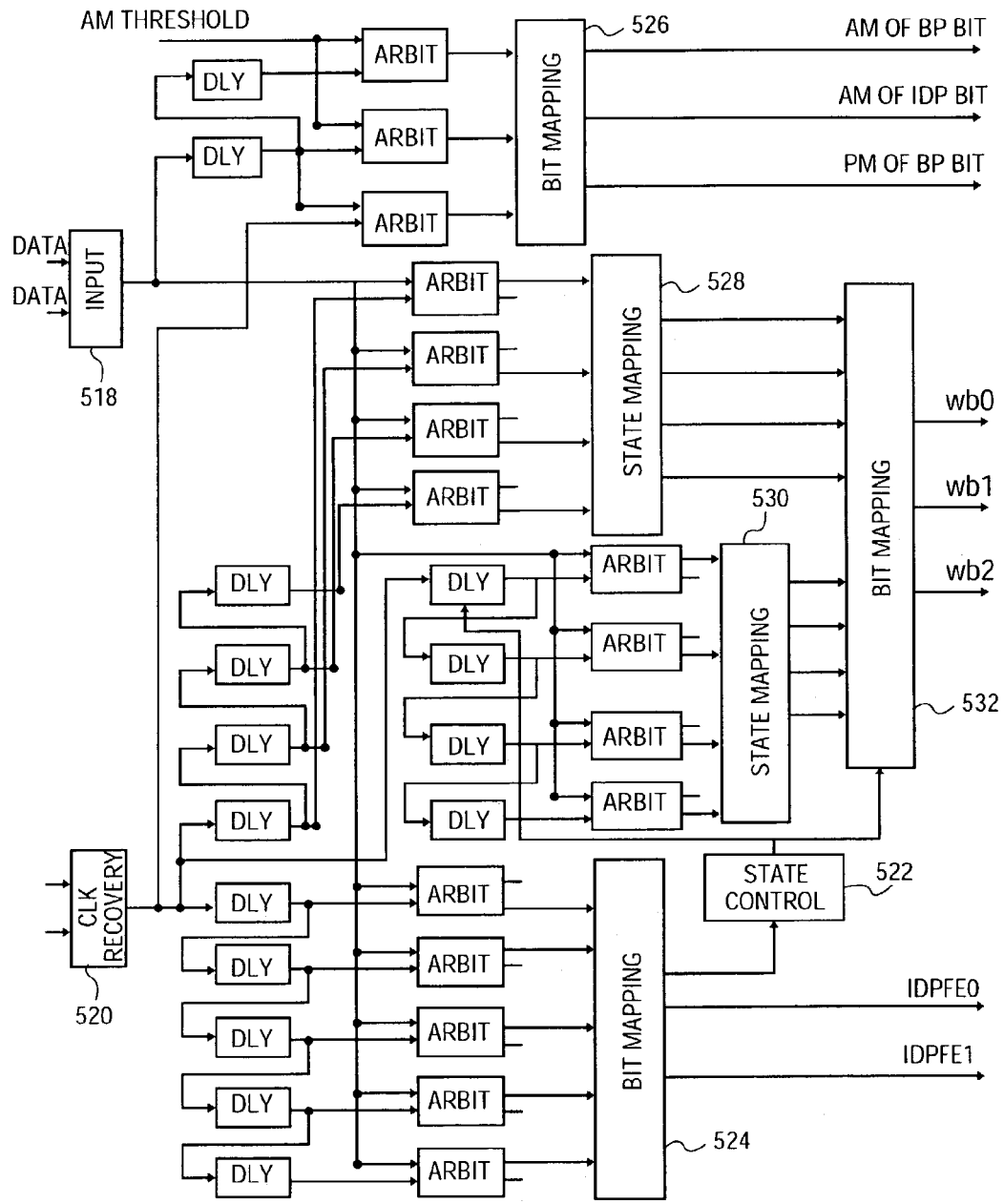
FIG. 5 is a block diagram of the demodulator of one embodiment of the invention.

FIG. 5 is a block diagram of the demodulator of one embodiment of the invention. The data is received in input 518 while the forwarded clock is received at clock recovery circuit 520. The clock is recovered in the clock recovery circuit 520 and passed into the demodulator as shown. The data is similarly forwarded into the demodulator as shown. Comparison of delayed data with the AM threshold and the clock yield the two AM bits and the front edge bit of the basic pulse via a bit mapping unit 526. Comparison of the data with various levels of delay of the clock yields the two IDP front edge bits via bit mapping unit 524. Delays of the clock compared with the data signal also fed into state mapping units 528 and 530 which then provides their state information to bit mapping unit 532 which in turn yields the width bits wb0 through wb2. The state control unit 522 insures that the bit mapping unit 532 outputs the right bits base on the state and the group defined by the position of the IDP pulse.

Figure 6:
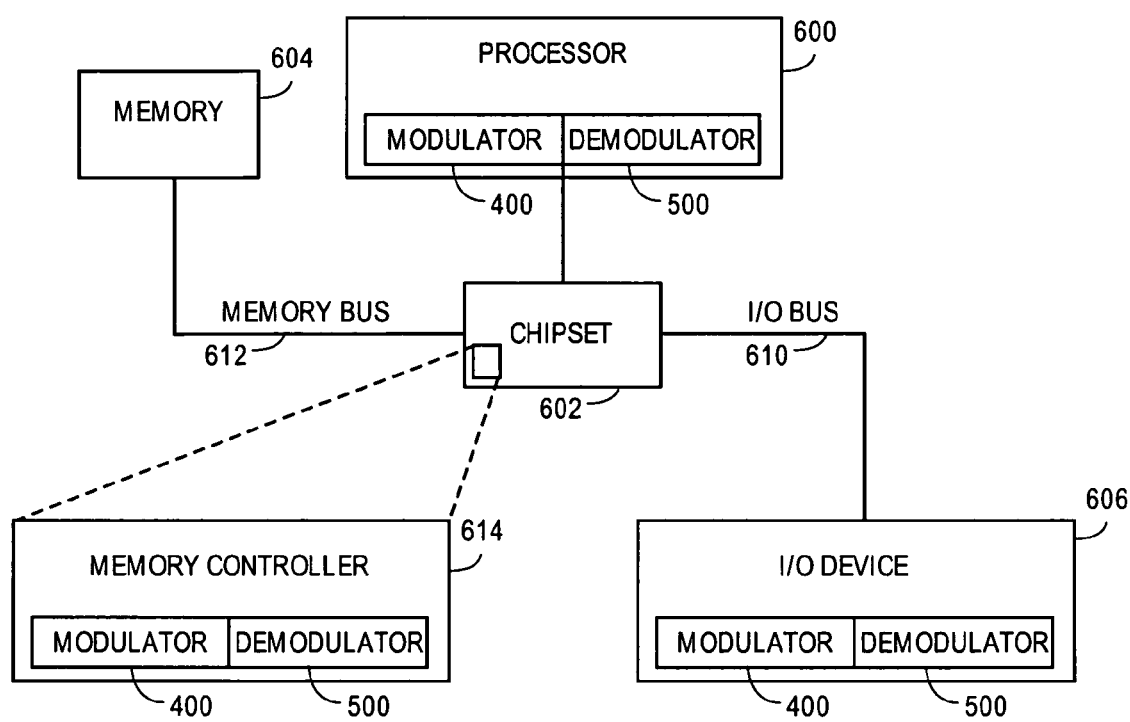
FIG. 6 is a block diagram of the system incorporating one embodiment of the invention.

FIG. 6 is a block diagram of the system incorporating one embodiment of the invention. The processor 600 includes a modulator 400 and demodulator 500. The processor is coupled to a chip set 602 which is coupled to a memory bus 612 and an I/O bus 610. The chip set includes a memory controller 614 which also includes a modulator 400 and a demodulator 500. The memory controller interacts with the memory 604 over memory bus 612. In such an embodiment, the memory interface may or may not include a modulation 400 and demodulator 500, as a benefit is achieved even where only the communication between the processor 600 and the memory controller 614 occurs at the high speeds provided by the described modulation scheme. An I/O device 606 which also contains a modulator 400 and a demodulator 500 is coupled to I/O bus 610 and may receive symbols modulated as previously described such that a position of an additional pulse within the symbol period encodes at least one bit. The I/O device may include, for example, a disk controller.

In another embodiment, the memory controller is embedded in the processor. Such an embodiment may or may not have a chip set, but in any event, the memory interface would need to have the corresponding modulator/demodulator to gain a benefit of the described modulation technique during memory accesses. Also, in such an embodiment (assuming a chip set is present) the chip set need not have the modulator and demodulator for a benefit to be realized.

In the foregoing specification, the invention has been described with reference to specific embodiments thereof. It will, however, be evident that various modifications and changes can be made thereto without departing from the broader spirit and scope of embodiments of the invention as set forth in the appended claims. The specification and drawings are, accordingly, to be regarded in an illustrative rather than a restrictive sense.

What is claimed is:

1. A method comprising:
    transmitting a first pulse during a symbol period, the first pulse providing both front and back edge position modulation, wherein the first pulse has a leading slot to encode a first bit; and transmitting a second pulse during the symbol period following a gap, the second pulse moveable within the symbol period, wherein the second pulse has a leading slot and at least one lagging slot such that a position of the leading slot of the second pulse within the symbol period modulates at least one second bit, and a position of an at least one lagging slot of the first pulse in combination with a position of the at least one lagging slot of the second pulse encodes at least one third bit independent of the encoding of the first bit and the at least one second bit.

2. The method of claim 1 wherein a position of a base pulse of the first pulse is fixed within the symbol period.

3. The method of claim 1 further comprising amplitude modulating both the first pulse and the second pulse.

4. The method of claim 3 wherein the amplitude modulation is non-return to zero (NRZ) amplitude modulation.

5. The method of claim 1 wherein the first pulse has at least one leading slot and at least one lagging slot with the leading slot wider than the lagging slot.

6. The method of claim 1 further comprising:
transmitting N additional pulses during the symbol period each additional pulse following a gap after its predecessor and each additional pulse moveable within the symbol period such that the position of the additional pulse within the symbol period modulates at least one bit; and
where N is a positive integer.

7. The method of claim 6 wherein the N additional pulses and the second pulse do not all have a same format.

8. An apparatus comprising:
a modulator to encode data as symbols, wherein each symbol includes a first pulse having a base pulse width, a leading edge and at least one lagging slot, the leading edge of the first pulse to encode at least one first bit, and a second pulse having a second base pulse width with a leading edge and at least one lagging slot, the leading edge of the second pulse positionable within a symbol period to encode at least one second bit, and a position of the at least one lagging slot of the first pulse in combination with the position of the at least one lagging slot of the second pulse encodes at least one third bit independent of the encoding of the at least one first bit and the at least one second bit.

9. The apparatus of claim 8, wherein the first pulse and the second pulse each encode at least one bit based on an amplitude of the pulse.

10. The apparatus of claim 8, wherein each symbol further includes N additional pulses each with having a base pulse with a leading edge and at least one lagging slot and the leading edge of each additional pulse positionable within the symbol period to encode at least one bit.

11. The apparatus of claim 8, wherein at least one of the first pulse and the second pulse encode at least one bit based on a rise time of the pulse.

12. The apparatus of claim 8, wherein slot size is nonuniform.

13. A system comprising:
a bus;
a processor coupled to the bus, the processor including a modulator to encode data as symbols, each symbol including at least a first pulse, wherein the first pulse has a leading slot to encode a first bit, and a second pulse such that a position of a leading slot of a base pulse of the second pulse encodes at least one second bit, and a position of the at least one lagging slot of the first pulse in combination with a position of an at least one lagging slot of the base pulse of the second pulse encodes at least one third bit independent of encoding of the the first bit and the at least one second bit;
a chip set coupled to the processor and including a demodulator to receive a symbol encoded by the modulator and decode at least one bit from a position of the back edge of the base pulse of the second pulse within the symbol period; and
a memory device coupled to the chip set.

14. The system of claim 13 wherein the modulator encodes at least on one bit in each of the first pulse and the second pulse through amplitude modulation.

15. The system of claim 14 wherein the modulator employs non-return to zero (NRZ) amplitude modulation.

16. The system of claim 13 wherein the modulator encodes at least one bit in a leading slot of the first pulse and at least one bit in a lagging slot of the first pulse.

17. The system of claim 16 wherein the modulation encodes at least one bit in a lagging slot of the second pulse.

18. The system of claim 13 wherein the device is less than 5" distant from the processor and the modulation has a payload of more than six giga bits per second.

19. The system of claim 13 wherein the device is more than 10" distant from the processor and the modulator has a payload of more than four giga bits per second.

20. The system of claim 13 wherein each symbol includes N additional pulses each having a base pulse position that encodes at least one bit.

21. A method comprising:
transmitting a first pulse during a symbol period, the first pulse including a leading slot and a lagging slot;
transmitting a second pulse during the symbol period following a gap, the second pulse moveable within the symbol period, the second pulse including a leading slot and a lagging slot;
modulating a combination of a position the lagging slot of the first pulse, a position of the leading slot of the second pulse, and a position of the lagging slot of the second pulse to encode five bits, wherein thirty-two states of modulation are provided from the five bits;
modulating the leading slot of the first pulse to encode a sixth bit;
encoding a seventh bit through amplitude modulation on the first pulse; and
encoding an eighth bit through amplitude modulation on the second pulse.

* * * * *